(12) United States Patent
Chou et al.

(10) Patent No.: US 10,812,057 B1
(45) Date of Patent: Oct. 20, 2020

(54) TIME DETECTION CIRCUIT AND TIME DETECTION METHOD

(71) Applicant: Faraday Technology Corp., Hsinchu (TW)

(72) Inventors: Pei-Yuan Chou, Hsinchu (TW); Jinn-Shyan Wang, Hsinchu (TW); Chuen-Shiu Chen, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/726,943

(22) Filed: Dec. 26, 2019

(30) Foreign Application Priority Data

Aug. 21, 2019 (TW) .............................. 108129902 A

(51) Int. Cl.
```
G01R 25/00      (2006.01)
H03D 13/00      (2006.01)
H03K 5/19       (2006.01)
H03L 7/085      (2006.01)
```
(52) U.S. Cl.
CPC .............. *H03K 5/19* (2013.01); *H03D 13/003* (2013.01); *H03L 7/085* (2013.01)

(58) Field of Classification Search
CPC ........ H03D 13/004; H03K 5/26; G01R 25/00; H03L 7/0891; H03L 7/085
USPC ....................................................... 327/3, 12
See application file for complete search history.

(56) References Cited

U.S. PATENT DOCUMENTS

| | | | | |
|---|---|---|---|---|
| 8,085,074 B1* | 12/2011 | Janardhanan | ............. | H03L 7/10 327/149 |
| 2008/0037662 A1* | 2/2008 | Ravi | ....................... | H03F 3/217 375/260 |
| 2011/0279299 A1* | 11/2011 | Lee | ........................ | G04F 10/005 341/166 |
| 2011/0304357 A1* | 12/2011 | Tokairin | ................... | H03K 5/26 327/12 |
| 2012/0099688 A1* | 4/2012 | Nishi | .................... | H04L 7/0338 375/355 |
| 2014/0139277 A1* | 5/2014 | Subramanian | ........ | H03L 7/0812 327/158 |

* cited by examiner

*Primary Examiner* — Anh Q Tra
(74) *Attorney, Agent, or Firm* — Winston Hsu

(57) ABSTRACT

A time detection circuit and a time detection method are provided. The time detection circuit includes an input signal processor and a time signal amplifier. The input signal processor receives a first input signal and a second input signal, calculates a time difference value between the first input signal and the second input signal, adjusts the time difference value by comparing the time difference value with a set reference value, and provides the adjusted time difference value. The time signal amplifier receives the adjusted time difference value, and amplifies the adjusted time difference value to generate an amplified time signal. The time signal amplifier operates in a linear operation region between a first time value and a second time value, and the set reference value is set according to the first time value and the second time value.

18 Claims, 9 Drawing Sheets

TIME DETECTION CIRCUIT AND TIME DETECTION METHOD

CROSS-REFERENCE TO RELATED APPLICATION

This application claims the priority benefit of Taiwan application serial no. 108129902, filed on Aug. 21, 2019. The entirety of the above-mentioned patent application is hereby incorporated by reference herein and made a part of this specification.

BACKGROUND

Technical Field

The disclosure generally relates to a time detection circuit and a time detection method, and particularly to a time detection circuit and a time detection method for pre-adjusting an input signal.

Description of Related Art

In the known technical field, a signal jitter state is usually detected by providing a time detection circuit for signals transmitted between circuits. According to the conventional art, time detection is performed by a time signal amplifier. Referring to FIG. 1 showing a curve diagram of a relationship between an input signal and an output signal of a conventional time signal amplifier, the known time signal amplifier may operate in linear operation regions LZ1 and LZ2 with a fixed gain A when a received input time difference value $\Delta TIN$ is between time values $\Delta T_{min}$ and $\Delta T_{max}$ and between $-\Delta T_{min}$ and $-\Delta T_{max}$. Comparatively, the conventional time signal amplifier operates in non-linear operation region NLZ1, NLZ2 or NLZ3 when the received input time difference value $\Delta TIN$ is between time values $-\Delta T_{min}$ and $\Delta T_{min}$, larger than time value $\Delta T_{max}$, or less than time value $-\Delta T_{min}$. In other words, when the received input time difference value $\Delta TIN$ is in the non-linear operation region NLZ1, NLZ2 or NLZ3, an amplification time difference value $\Delta TOUT$ that is generated may exhibit distortion to a certain extent, which reduces the accuracy of time length detection.

SUMMARY

The disclosure provides a time detection circuit and a time detection method for improving the accuracy of a time detection result.

The time detection circuit of the disclosure includes an input signal processor and a time signal amplifier. The input signal processor receives a first input signal and a second input signal, calculates a time difference value between the first input signal and the second input signal, adjusts the time difference value by comparing the time difference value with a set reference value, and provides an adjusted time difference value. The time signal amplifier receives the adjusted time difference value, and amplifies the adjusted time difference value to generate an amplified time signal, wherein the time signal amplifier operates in a linear operation region between a first time value and a second time value, and the set reference value is set according to the first time value and the second time value.

In an embodiment of the disclosure, the first time value is smaller than the second time value, the set reference value is larger than the first time value, and a two-fold of the set reference value is smaller than the second time value.

In an embodiment of the disclosure, when the time difference value is smaller than the set reference value, the input signal processor subtracts a two-fold of the set reference value by the time difference value to generate the adjusted time difference value.

In an embodiment of the disclosure, the time detection circuit further includes a processor. The processor is coupled to the time signal amplifier, receives the amplified time signal, and generates an output time signal according to the amplified time signal, wherein the output time signal is equal to: the two-fold of the set reference value−the amplified time signal/A, wherein A is an amplified gain of the time signal amplifier in the linear operation region.

In an embodiment of the disclosure, when the time difference value is not smaller than the set reference value, the input signal processor divides the time difference value by the set reference value to obtain a quotient value and a remainder value, and subtracts the two-fold of the set reference value by the remainder value to obtain the adjusted time difference value, wherein the quotient value is a positive integer.

In an embodiment of the disclosure, the time detection circuit further comprises a processor. The processor is coupled to the time signal amplifier, receives the amplified time signal and generates an output time signal according to the amplified time signal, wherein the output time signal is equal to: (N+2)×the set reference value−the amplified time signal/A, wherein A is the amplified gain of the time signal amplifier in the linear operation region, and N is the quotient value.

In an embodiment of the disclosure, the input signal processor includes a first delay string, a second delay string, a plurality of latches, a plurality of comparison circuits and a multiplex circuit. The first delay string comprises a plurality of first delayers connected in series, each of the first delayers providing a first delay value. The first delay string receives the first input signal and generates a plurality of first delay signals. The second delay string comprises a plurality of second delayers connected in series, each of the second delayers providing a second delay value, wherein a difference value between the first delay value and the second delay value is equal to the set reference value. The second delay string receives the second input signal and generates a plurality of second delay signals. The latches respectively receive the first delay signals, and respectively receive the second delay signals. The latches respectively latch the first delay signals according to the second delay signals to generate a plurality of latch values. The comparison circuits respectively correspond to the latches, each of the comparison circuits comparing two adjacent latch values to generate a plurality of detection values. The multiplex circuit receives the first delay signals, the second delay signals and the detection values. The multiplex circuit selects one of the first delay signals according to the detection values to generate a first output signal, selects one of the second delay signals according to the detection values to generate a second output signal.

In an embodiment of the disclosure, a time difference value between the first output signal and the second output signal is equal to the adjusted time difference value.

A time detection method of the disclosure includes: receiving a first input signal and a second input signal, calculating a time difference value between the first input signal and the second input signal, adjusting the time difference value by comparing the time difference value with a set reference value and providing an adjusted time difference value; and providing a time signal amplifier to receive the adjusted time difference value and amplify the adjusted time difference value to generate an amplified time signal, wherein the time signal amplifier operates in a linear operation region between the first time value and the second time value, and the set reference value is set according to the first time value and the second time value.

Based on the above, in the disclosure, pre-adjustment is performed according to the time difference value between the first input signal and the second input signal, and the adjusted time difference value received by the time signal amplifier falls in the linear operation region of the time signal amplifier. In this way, the time signal amplifier linearly amplifies the adjusted time difference value, and maintains the accuracy of the generated time detection result.

In order to make the aforementioned and other objectives and advantages of the disclosure comprehensible, embodiments accompanied with figures are described in detail below.

DESCRIPTION OF THE EMBODIMENTS

Figure 2:
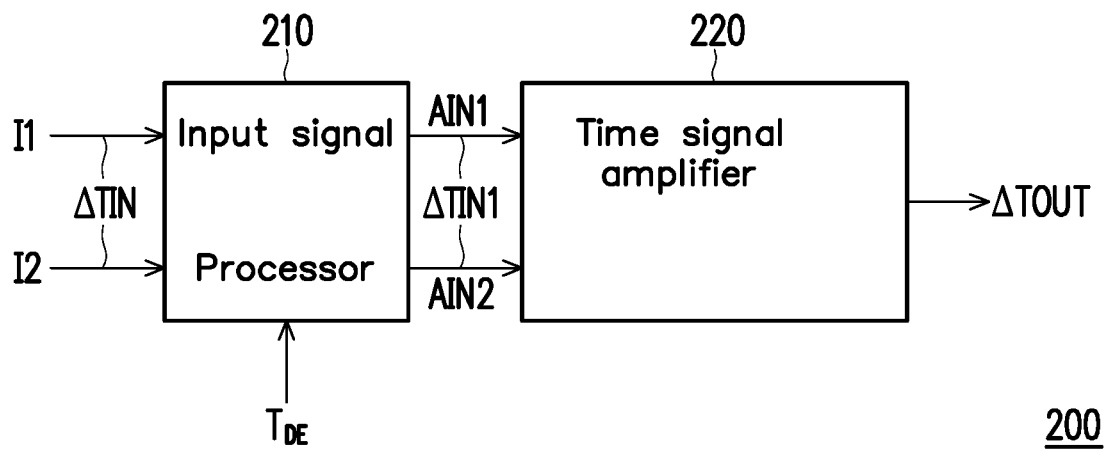
FIG. 2 shows a diagram of a time detection circuit according to an embodiment of the disclosure.

Referring to FIG. 2, FIG. 2 shows a diagram of a time detection circuit according to an embodiment of the disclosure. A time detection circuit 200 includes an input signal processor 210 and a time signal amplifier 220. The input signal processor 210 is coupled to the time signal amplifier 220. The input signal processor 210 receives a first input signal I1 and a second input signal I2. The input signal processor 210 calculates a time difference value ΔTIN between the first input signal I1 and the second input signal I2. The input signal processor 210 adjusts the time difference value ΔTIN by comparing the time difference value ΔTIN with a set reference value $T_{DE}$, and therefore generates a first output signal AIN1 and a second output signal AIN2, and provides the adjusted time difference value ΔTIN1 through a phase difference between the first output signal AIN1 and the second output signal AIN2.

Here, the time difference value ΔTIN is generated according to the phase difference between the first input signal I1 and the second input signal I2. In detail, the time difference value ΔTIN is generated by calculating a time difference value between a transition point of the first input signal I1 and a transition point of the second input signal I2. The above-mentioned transition points are a time point transiting from a high logic level to a low logic level, or a time point transiting from a low logic level to a high logic level, and has no certain limitation.

On the other hand, the time signal amplifier 220 is coupled to the input signal processor 210. The time signal amplifier 220 receives the adjusted time difference value ΔTIN1, and amplifies the adjusted time difference value ΔTIN1 to generate an amplified time signal ΔTOUT. It should be noted here that the adjusted time difference value ΔTIN1 falls in a linear operation region of the time signal amplifier 220 through the input signal processor 210. In this way, through amplification of the adjusted time difference value ΔTIN1, the time signal amplifier 220 generates the low-distortion amplified time signal ΔTOUT and improves the time detection accuracy of the time detection circuit 200.

It should be noted here that in an embodiment of the disclosure, the set reference value $T_{DE}$ is set according to the linear operation region of the time signal amplifier 220, wherein the time signal amplifier 220 operates in the linear operation region between the first time value and the second time value, and the set reference value $T_{DE}$ is set according to the first time value and the second time value. In detail, on the premise that the first time value is smaller than the second time value, the set reference value $T_{DE}$ is larger than the first time value, and the two-fold of the set reference value $T_{DE}$ is smaller than the second time value.

Figure 3:
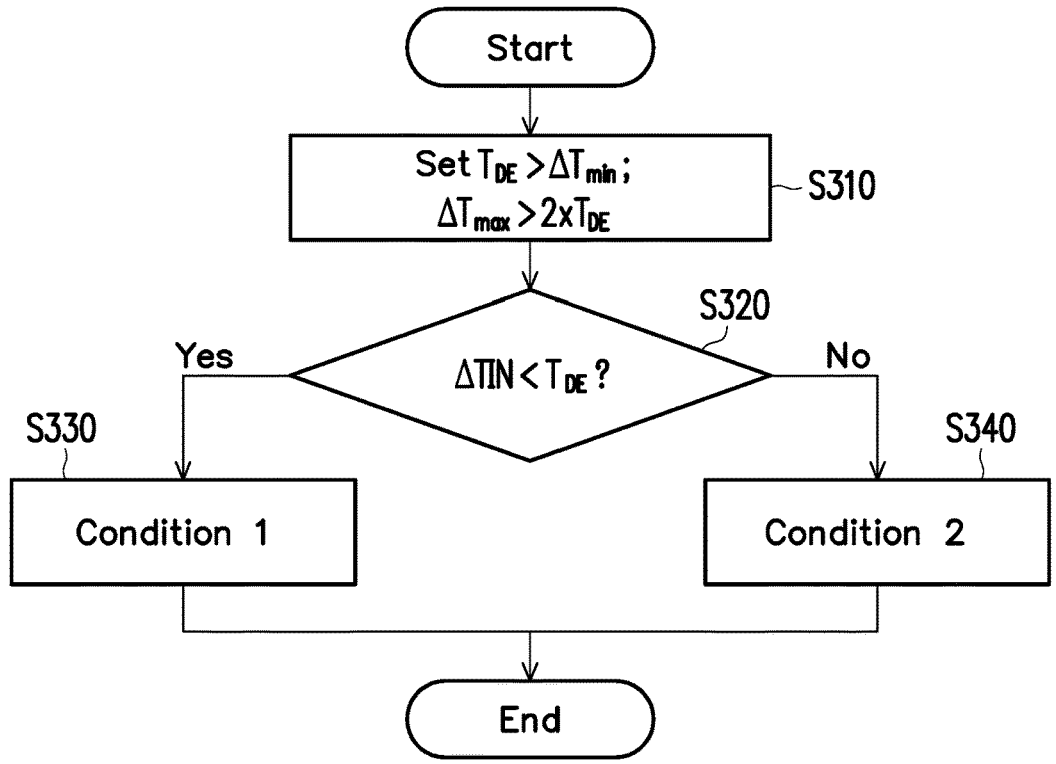
FIG. 3 shows an operation flowchart of a time detection circuit according to an embodiment of the disclosure.
Figure 4:
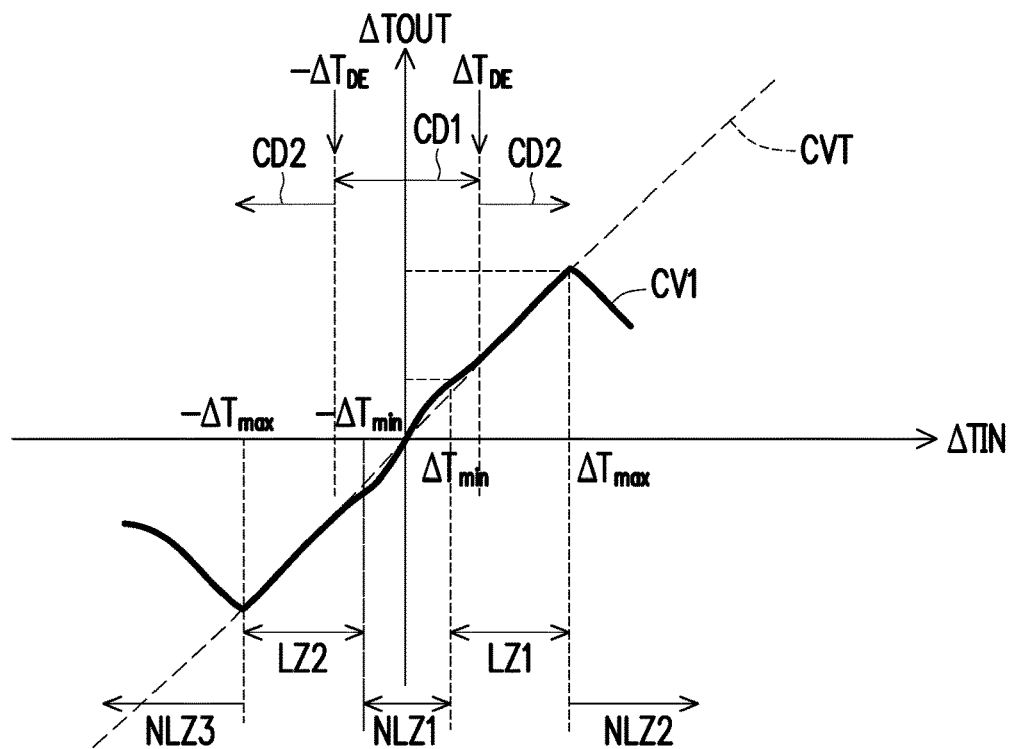
FIG. 4 shows an operation curve diagram of a time signal amplifier according to an embodiment of the disclosure.

For operation details of the time detection circuit 200, reference is made to FIG. 3 showing an operation flowchart of a time detection circuit according to an embodiment of the disclosure. In FIG. 3, a set operation of the set reference value $T_{DE}$ is performed in step S310, here, reference is synchronously made to FIG. 4 showing an operation curve diagram of a time detection circuit according to an embodiment of the disclosure. In FIG. 4, a curve CV1 is the operation curve of the time signal amplifier. A horizontal axis corresponding to the curve CV1 represents a time difference value ΔTIN1 received by the time signal amplifier, and a vertical axis corresponding to the curve CV1 represents an amplification time difference value ΔTOUT generated by the time signal amplifier. It can be seen from the curve CV1 that the time signal amplifier operates in a linear operation region LZ1 between a first time value $\Delta T_{min}$ and a second time value $\Delta T_{max}$, and also operates in a linear operation region LZ2 between a first time value $-\Delta T_{min}$ and a second time value $-\Delta T_{max}$. Relatively, the time signal amplifier operates in a non-linear operation region NLZ1 between the first time value $-\Delta T_{min}$ and the first time value $-\Delta T_{min}$, and respectively operates in non-linear operation regions NLZ2 and NLZ3 when the time is larger than the second time value $\Delta T_{max}$ and less than the second time value $-\Delta T_{max}$.

In the step S310, the set reference value $T_{DE}$ is set, the set reference value $T_{DE}$ is larger than the first time value $\Delta T_{min}$, and the two-fold of the set reference value $T_{DE}$ ($2 \times T_{DE}$) is smaller than the second time value $\Delta T_{max}$. Similarly, a negative set reference value $-T_{DE}$ is set in the step S310, wherein an absolute value of the set reference value $-T_{DE}$ is larger than an absolute value of the first time value $-\Delta T_{min}$, an absolute value of the two-fold of the set reference value $-T_{DE}$ is smaller than an absolute value of the second time value $-\Delta T_{max}$.

In step S320, the time difference value ΔTIN is compared with the set reference value $T_{DE}$. When the time difference value ΔTIN is smaller than the set reference value $T_{DE}$, a condition 1 CD1 (step S330) is entered, and when the time difference value ΔTIN is not smaller than the set reference value $T_{DE}$, a condition 2 CD2 (step S340) is entered.

Through the above adjustment mechanism, an operation curve of the time detection circuit 200 is equivalent to a target amplification curve CVT.

Figure 5:
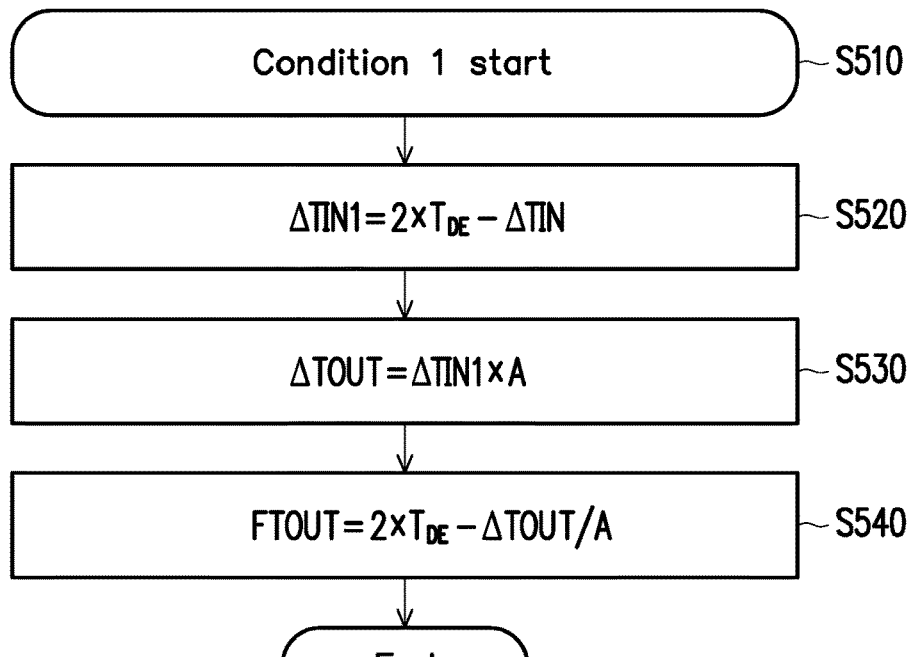
FIG. 5 and FIG. 6 respectively show operation flowcharts of conditions 1 and 2 according to the embodiment of FIG. 3 of the disclosure.
Figure 6:
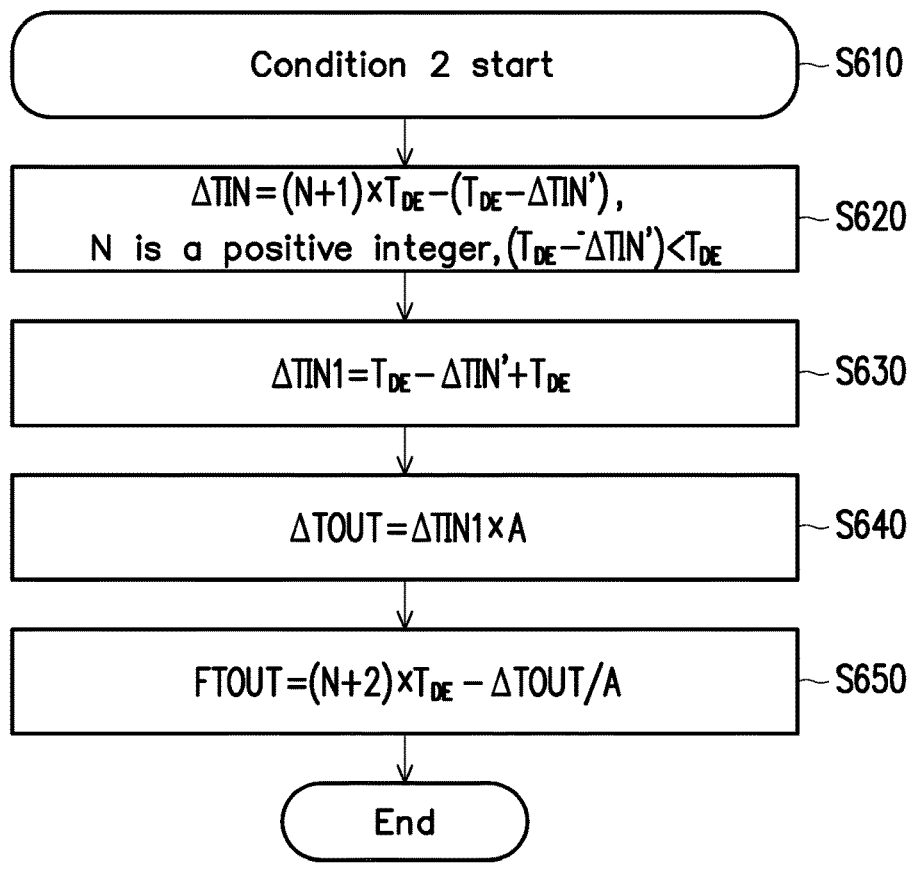

Next, referring to FIG. 5 and FIG. 6. FIG. 5 and FIG. 6 respectively show operation flowcharts of conditions 1 and 2 according to the embodiment of FIG. 3 of the disclosure. In FIG. 5, an operation under the condition 1 is started in step S510, and in step S520, the time difference value ΔTIN is plus the set reference value $T_{DE}$ through the input signal processor to generate the adjusted time difference value ΔTIN1. Under the condition 1, the time difference value ΔTIN is smaller than the set reference value $T_{DE}$. Thus, the adjusted time difference value ΔTIN1 falls in the linear operation region of the time signal amplifier by subtracting the two-fold of the set reference value $T_{DE}$ by the time difference value ΔTIN. Also thus, in step S530, the time signal amplifier amplifies the adjusted time difference value ΔTIN1 and generates the amplified time signal ΔTOUT, wherein the amplified time signal ΔTOUT=ΔTIN1×A, wherein A is the amplified gain of the time signal amplifier in the linear operation region.

Subsequently, in step S540, an output time signal FTOUT is generated according to the amplified time signal ΔTOUT, wherein in the step S540, the output time signal FTOUT=the two-fold of the set reference value $T_{DE}$-the amplified time signal ΔTOUT/A. In this way, an accurate time detection result is obtained.

On the other hand, in FIG. 6, an operation under the condition 2 is performed in step S610, and in step S620, the time difference value ΔTIN is divided by the set reference value $T_{DE}$ thorough the input signal processor so as to generate a quotient value N and a remainder value ΔTIN, wherein the quotient value N is a positive integer, ΔTIN= (N+1)×$T_{DE}$-($T_{DE}$-ΔTIN'), and $T_{DE}$-ΔTIN'<$T_{DE}$. Next, in step S630, the adjusted time difference value ΔTIN1 is generated according to the remainder value ΔTIN' and the set reference value $T_{DE}$, wherein in the step S620, the two-fold of the set reference value is subtracted by the remainder value ΔTIN' through the input signal processor to obtain the adjusted time difference value ΔTIN1.

Based on the above, the adjusted time difference value ΔTIN1 falls in the linear operation region of the time signal amplifier. Also thus, in step S640, the time signal amplifier amplifies the adjusted time difference value ΔTIN1 and generates the amplified time signal ΔTOUT, wherein the amplified time signal ΔTOUT=ΔTIN1×A.

Finally, in step S650, the output time signal FTOUT is generated according to the amplified time signal ΔTOUT, wherein the output time signal FTOUT=(N+2)×the set reference value $T_{DE}$-the amplified time signal/A, and therefore an accurate time detection result is obtained.

Figure 7:
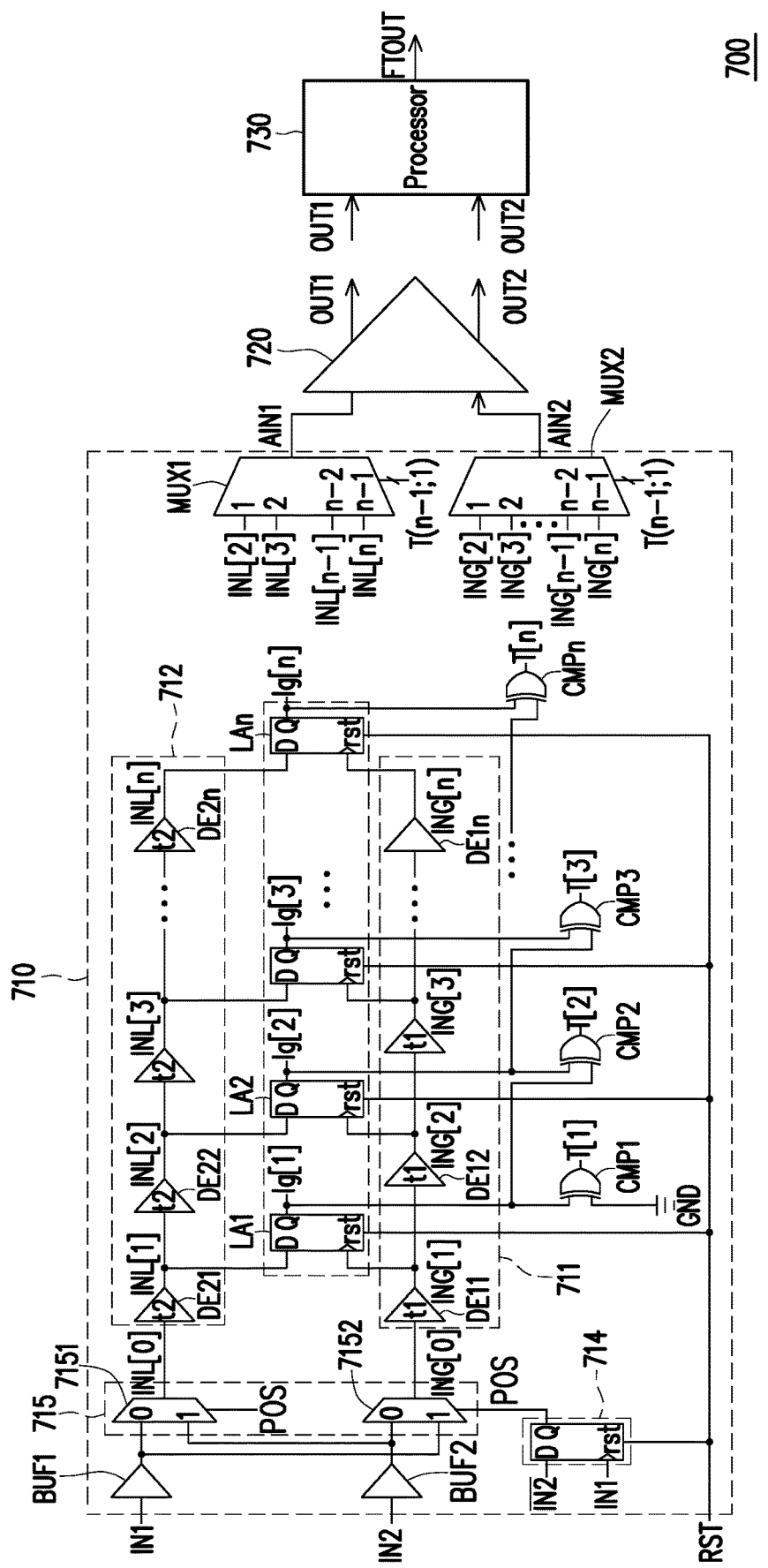
FIG. 7 shows a circuit diagram of a time detection circuit according to an embodiment of the disclosure.

Referring to FIG. 7, FIG. 7 shows a circuit diagram of a time detection circuit according to an embodiment of the disclosure. A time detection circuit 700 includes an input signal processor 710, a time signal amplifier 720 and a processor 730. The input signal processor 710 is coupled to the time signal amplifier 720. The input signal processor 710 includes a first delay string 711, a second delay string 712, latches LA1-LAn, comparison circuits CMP1-CMPn, multiplexers MUX1 and MUX2, a phase comparator 714, a signal convertor 715 and input buffers BUF1 and BUF2, wherein the multiplexers MUX1 and MUX2 constitute a multiplex circuit. The input signal processor 710 respectively receives a first front end input signal IN1 and a second front end input signal IN2 through the input buffers BUF1 and BUF2. In addition, the first front end input signal IN1 and the second front end input signal IN2 are simultaneously transmitted to the phase comparator 714 to determine a phase relationship between the first front end input signal IN1 and a second front end input signal IN2. In the present embodiment, the phase comparator 714 is a D flip-flop, wherein a data end D of the phase comparator 714 receives a reverse signal $\overline{IN2}$ of the second input signal, a clock end of the phase comparator 714 receives the first front end input signal IN1, a reset end rst of the phase comparator 714 receives a reset signal RST, and an output end Q of the phase comparator 714 generates a position signal POS, wherein the phase comparator 714 determines whether the phase of the first front end input signal IN1 precedes or falls behind the phase of the second front end input signal IN2. When the phase of the first front end input signal IN1 precedes the phase of the second front end input signal IN2, the phase comparator 714 generates the position signal POS being a logic level 1, relatively, when the phase of the first front end input signal IN1 falls behind the phase of the second front end input signal IN2, the phase comparator 714 generates the position signal POS being a logic level 0.

The signal convertor 715 is coupled to the input buffers BUF1 and BUF2, the phase comparator 714, the first delay string 711 and the second delay string 712. When the position signal POS is equal to the logic level 1, the signal convertor 715 respectively transmits the first front end signal IN1 and the second front end signal IN2 to the first delay string 711 and the second delay string 712. When the position signal POS is equal to the logic level 0, the signal convertor 715 transmits the first front end signal IN1 to the second delay string 712 and transmits the second front end signal IN2 to the first delay string 711. In the present embodiment, the signal convertor 715 includes multiplexers 7151 and 7152. The multiplexers 7151 and 7152 are coupled to output ends of the input buffers BUF1 and BUF2 and controlled by the position signal POS.

Figure 1:
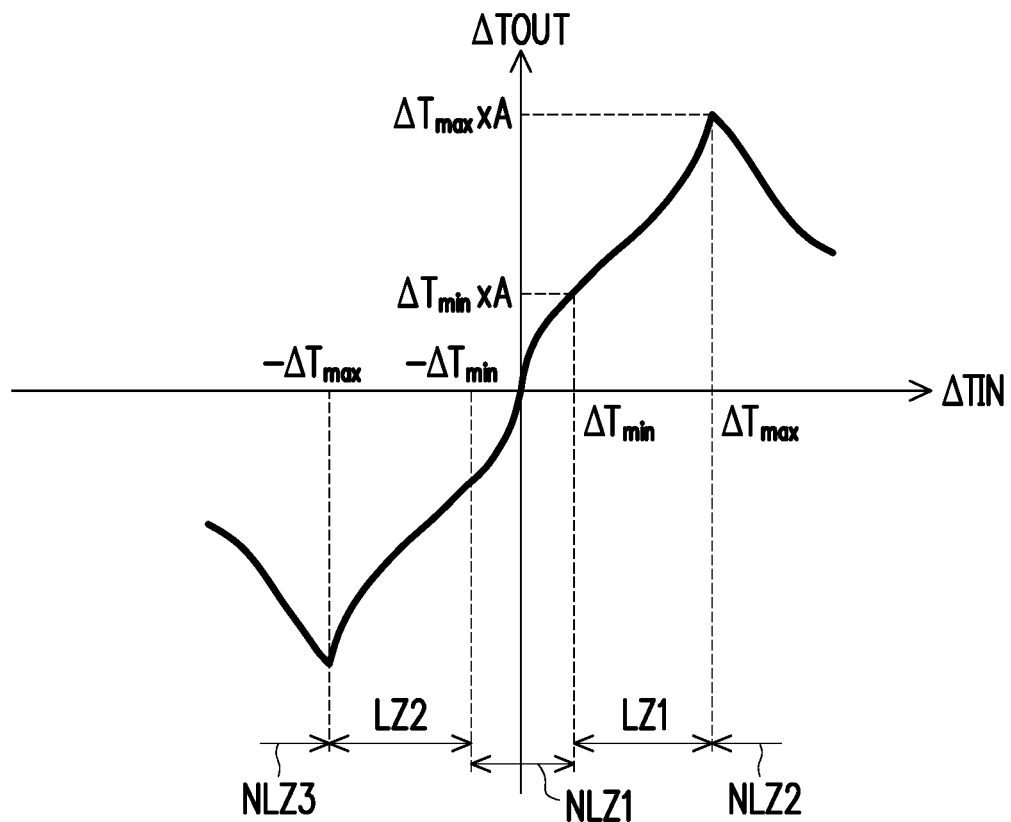
FIG. 1 shows a curve diagram of a relationship between an input signal and an output signal of a conventional time signal amplifier.

On the other hand, the first delay string 711 includes a plurality of first delayers DE11-DE1n connected in series and coupled in sequence. Each of the first delayers DE11-DE1n provides a first delay value t1. The first delay string 711 receives an input signal ING[0] generated by the multiplexer 7152 and generates a plurality of first delay signals ING[1]-ING[n] in sequence. The second delay string 712 includes a plurality of second delayers DE21-DE2n connected in series and coupled in sequence. Each of the second delayers DE21-DE2n provides a second delay value t2. The second delay string 712 receives an input signal ING[0] generated by the multiplexer 7151 and generates a plurality of second delay signals ING[1]-ING[n] in sequence, wherein the first delay value t1 is larger than the second delay value t2, and a difference value between the first delay value t1 and the second delay value t2 is equal to the set reference value $T_{DE}$. In addition, the phase of the input signal ING[0] precedes the phase of the input signal INL[0] under actions of the phase comparator 714 and the signal convertor 715. Here, the input signals ING[0] and INL[0] are respectively equivalent to the input signals I1 and I2 of FIG. 1 according to an embodiment of the disclosure.

The latches LA1-LAn respectively receive the first delay signals ING[1]-ING[n], and respectively receive the second delay signals INL[1]-INL[n]. The latches LA1-LAn respectively latch the second delay signals INL[1]-INL[n] according to the first delay signals ING[1]-ING[n] to generate a plurality of latch values lg[1]-lg[n]. In the present embodiment, the latches LA1-LAn are a plurality of D flip-flops. Data ends D of the latches LA1-LAn respectively receive the second delay signals INL[1]-INL[n], clock ends of the latches LA1-LAn respectively receive the first delay signals ING[1]-ING[n], reset ends rst of the latches LA1-LAn commonly receive a reset signal RST, and output ends of the latches LA1-LAn respectively output the latch values lg[1]-lg[n].

In the present embodiment, the comparison circuits CMP1-CMPn respectively correspond to the latches LA1-LAn. A first level of comparison circuit CMP1 receives a grounding voltage GND and the latch value lg[1], the subsequent comparison circuits CMP2-CMPn respectively receive two adjacent latch values to be compared. The comparison circuits CMP1-CMPn respectively generate a plurality of detection values T[1]-T[n]. The comparison circuits CMP1-CMPn are configured to detect a time point when the phase of the input signal ING[0] preceding the phase of the input signal INL[0] is changed into the phase of the input signal ING[0] falling behind the phase of the input signal INL[0]. In the present embodiment, various comparison circuits CMP1-CMPn are XOR gates.

In addition, in the multiplex circuit, the multiplexer MUX1 receives the second delay signals INL[2]-INL[n] and detection values T[n−1]:T[1], the multiplex MUX2 receives the first delay signals ING[2]-ING[n] and detection values T[n−1]:T[1]. The multiplexers MUX1 and MUX2 select one of the second delay signals INL[2]-INL[n] and one of the first delay signals ING[2]-ING[n] according to the detection values T[n−1]:T[1] to respectively generate output signals AIN1 and AIN2. The phase difference between the output signals AIN1 and AIN2 is used for providing the adjusted time difference value.

In the present embodiment, the time signal amplifier 720 receives the output signals AIN1 and AIN2, and amplifies the adjusted time difference value provided by the output signals AIN1 and AIN2 to generate signals OUT1 and OUT2 for providing the amplified time signal, wherein the amplified time signal is obtained based on the phase difference between the signals OUT1 and OUT2. Moreover, the processor 730 is coupled to the time signal amplifier 720, and adjusts the amplified time signal under the condition 1 or condition 2, and obtains the output time signal FTOUT, wherein under the condition 1, the processor 730 generates the output time signal FTOUT according to the step S540 of FIG. 5. Furthermore, under the condition 2, the processor 730 generates the output time signal FTOUT according to the step S650 of FIG. 6.

Incidentally, the time signal amplifier 720 is implemented by using any time signal amplifier circuit known to those with the general knowledge in this field, and the processor 730 is implemented by using any circuit that executes operations without specific limitations.

Figure 8A:
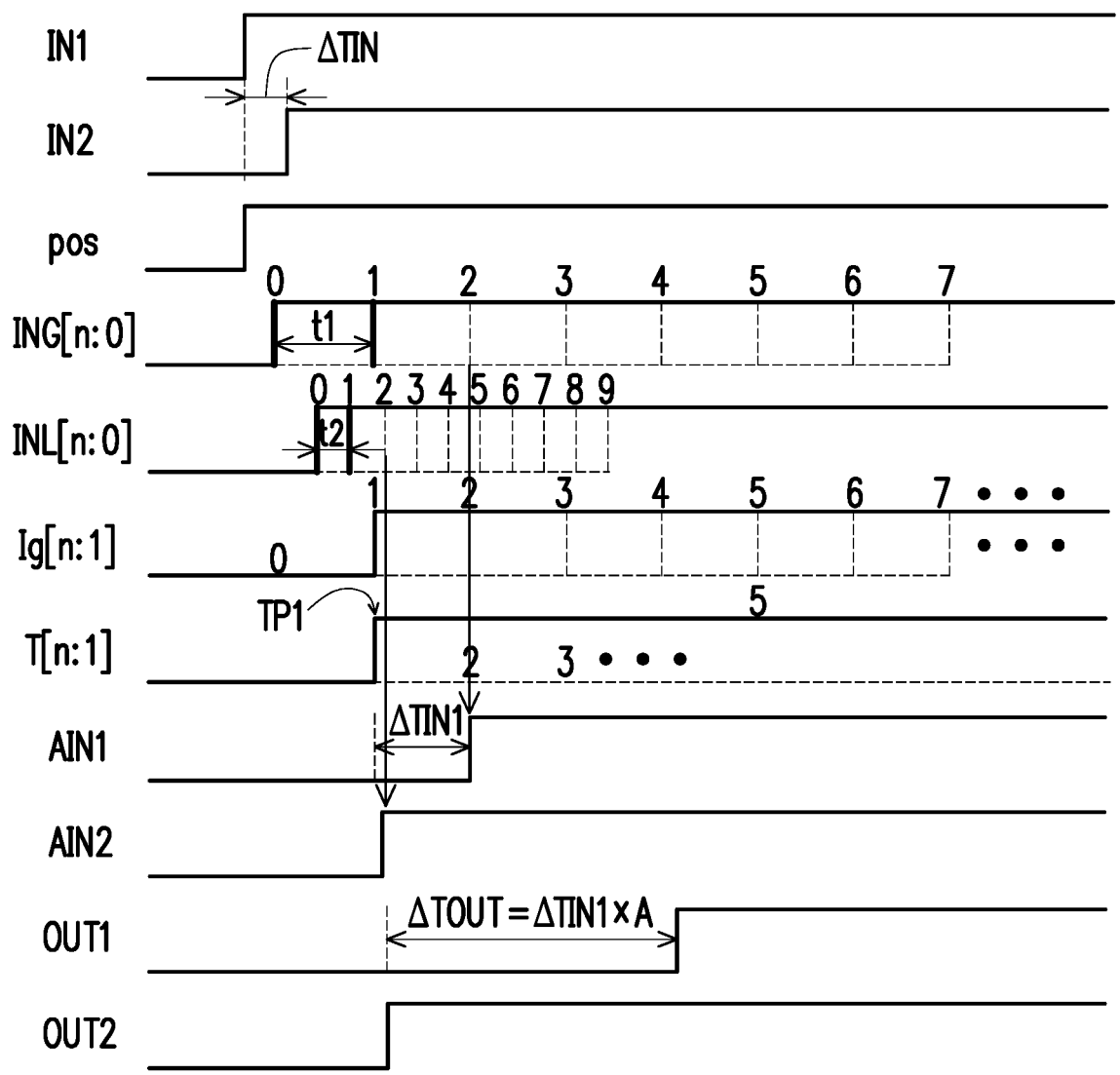
FIGS. 8A, 8B, 9A and 9B respectively show multiple operation waveform diagrams of a time detection circuit according to an embodiment of the disclosure.

In the aspect of detailed operations, reference is synchronously made to FIG. 7 and FIGS. 8A, 8B, 9A and 9B. FIGS. 8A, 8B, 9A and 9B respectively show a plurality of operation waveform diagrams of a time detection circuit according to an embodiment of the disclosure. In FIG. 8A, the phase of the first front end input signal IN1 precedes the phase of the second front end input signal IN2, the phase difference between the first front end input signal IN1 and the second front end input signal IN2 provides the time difference value ΔTIN, and the time difference value ΔTIN is smaller than the set reference value $T_{DE}$. That is to say, a time detection circuit 700 operates under the condition 1.

Based on a fact that the phase of the first front end input signal IN1 precedes the phase of the second front end input signal IN2, the position signal POS is the logic level 1. Thus, the front end input signal ING[0] is generated according to the first front end input signal IN1, and the front end input signal ING[0] is generated according to the second front end input signal IN2. In addition, the first delay string 711 generates the first delay signal ING[n:1] through step-by-step delay of the input signal ING[0] according to the first delay value t1, and the second delay string 712 generates the second delay signals INL[n:1] through step-by-step delay of the input signal ING[0] according to the first delay value t2.

In FIG. 8A, the phase of the input signal ING[0] precedes the phase of the input signal INL[0], but the phases of the first delay signals ING[n:1] fall behind the respectively corresponding phases of the second delay signals INL[n:1]. Thus, the second delay signals INL[n:1] are respectively latched according to the first delay signals ING[n:1] to obtain step-by-step delayed latch values lg[n:1]. In addition, a detection value T[n:1] which is transited into the logic level 1 at a time point TP1 is obtained by comparing two adjacent latch values lg[n:1]. Here, the time point TP1 corresponds to the transition time point of the first delay signal ING[1].

Furthermore, the multiplexer MUX2 selects the first delay signal ING[2] according to the detection value T[n:1] to generate the output signal AIN2, the multiplexer MUX1 selects the second delay signal INL[2] according to the detection value T[n:1] to generate the output signal AIN1, wherein the time difference value of the transition points of the output signal AIN2 and the output signal AIN1 is the adjusted time difference value ΔTIN1, and is equal to a value that is obtained by subtracting the two-fold of the set reference value $T_{DE}$ by the time difference value ΔTIN1.

Here, the time signal amplifier 720 amplifies the adjusted time difference value ΔTIN1 provided by the output signal AIN2 and the output signal AIN1, and generates signals OUT1 and OUT2, wherein the amplified time signal provided by the signals OUT1 and OUT2 is equal to the adjusted time difference value ΔTIN1 multiplied by an amplified gain A.

Figure 8B:
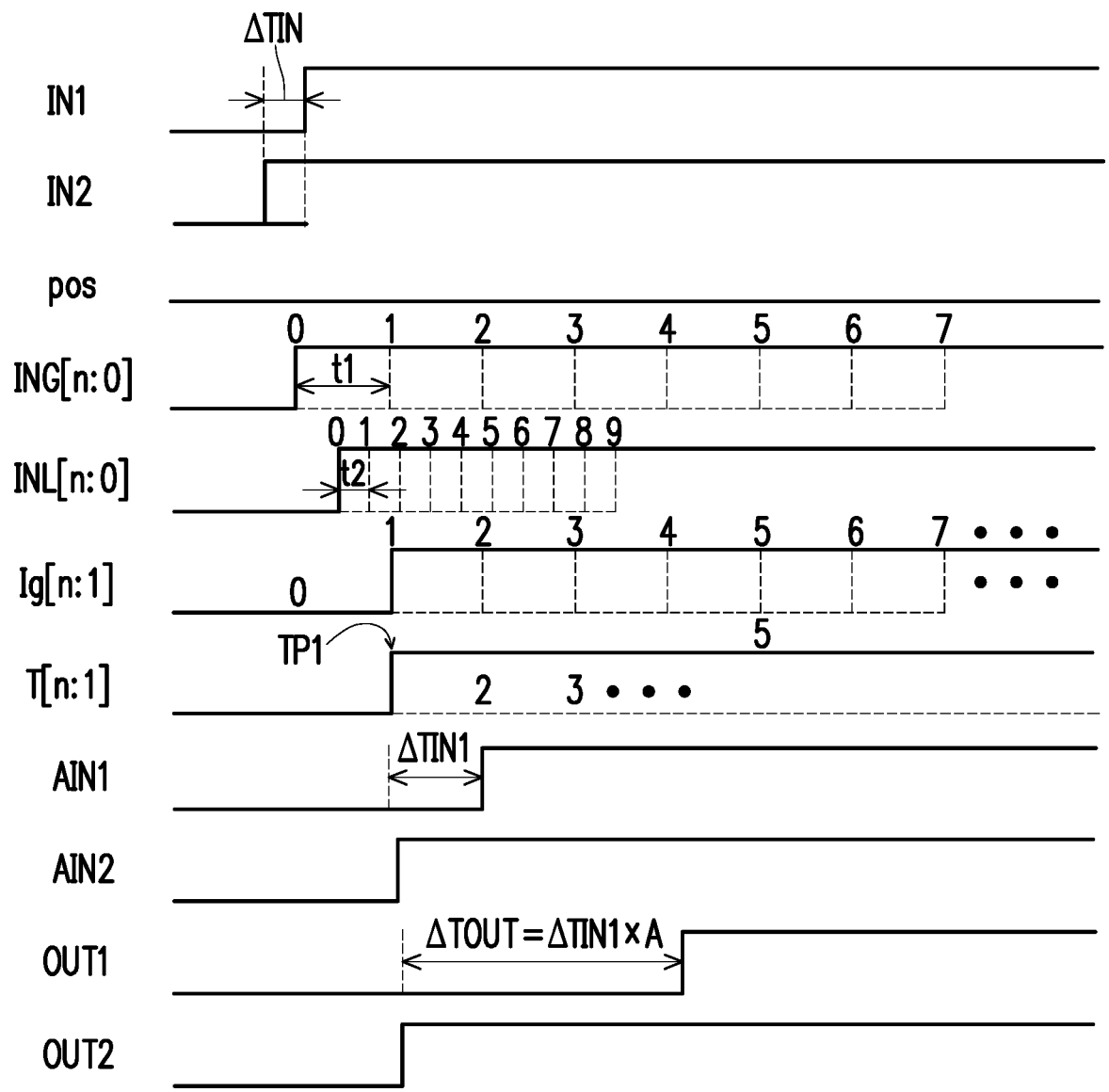

In addition, in FIG. 8B, the phase of the first front end input signal IN1 falls behind the phase of the second front end input signal IN2. The phase difference between the first front end input signal IN1 and the second front end input signal IN2 provides the time difference value ΔTIN, and the time difference value ΔTIN is smaller than the set reference value $T_{DE}$. That is to say, the time detection circuit 700 operates under the condition 1 as well.

Based on a fact that the phase of the first front end input signal IN1 falls behind the phase of the second front end input signal IN2, the position signal POS is the logic level 0. Therefore, the input signal ING[0] is generated by the second input signal IN2, and the input signal INL[0] is generated according to the first input signal IN1. In addition, the first delay string 711 generates the first delay signal ING[n:1] through step-by-step delay of the input signal ING[0] according to the first delay value t1, and the second delay string 712 generates the second delay signal INL[n:1] through step-by-step delay of the input signal INL[0] according to the first delay value t2.

In FIG. 8B, the phase of the input signal ING[0] precedes the phase of the input signal INL[0], but the phases of the first delay signals ING[n:1] all fall behind the phases of the respectively corresponding second delay signals INL[n:1]. Therefore, the step-by-step delayed latch values lg[n:1] are obtained by respectively latching the second delay signals INL[n:1] according to the first delay signals ING[n:1]. In addition, the detection value T[n:1] that is transited to the logic level 1 is obtained by comparing the two adjacent latch values lg[n:1]. Here, the time point TP1 corresponds to the transition time point of the first delay signal ING[1].

Furthermore, the multiplexer MUX2 selects the first delay signal ING[2] to generate the output signal AIN2 according to the detection value T[n:1], and the multiplexer MUX1 selects the second delay signal INL[2] to generate the output signal AIN1 according to the detection value T[n:1], wherein the time difference value between the transition points of the output signal AIN2 and the output signal AIN1 is the adjusted time difference value $\Delta$TIN1, and is equal to the two-fold of the set reference value $T_{DE}$ subtracted by the time difference value $\Delta$TIN.

Here, the time signal amplifier 720 amplifies the adjusted time difference value $\Delta$TIN1 provided by the output signal AIN2 and the output signal AIN1, and generates signals OUT1 and OUT2, wherein the amplified time signal $\Delta$TOUT provided by the signals OUT1 and OUT2 is equal to the adjusted time difference value $\Delta$TIN1 multiplied by the amplified gain A.

Figure 9A:
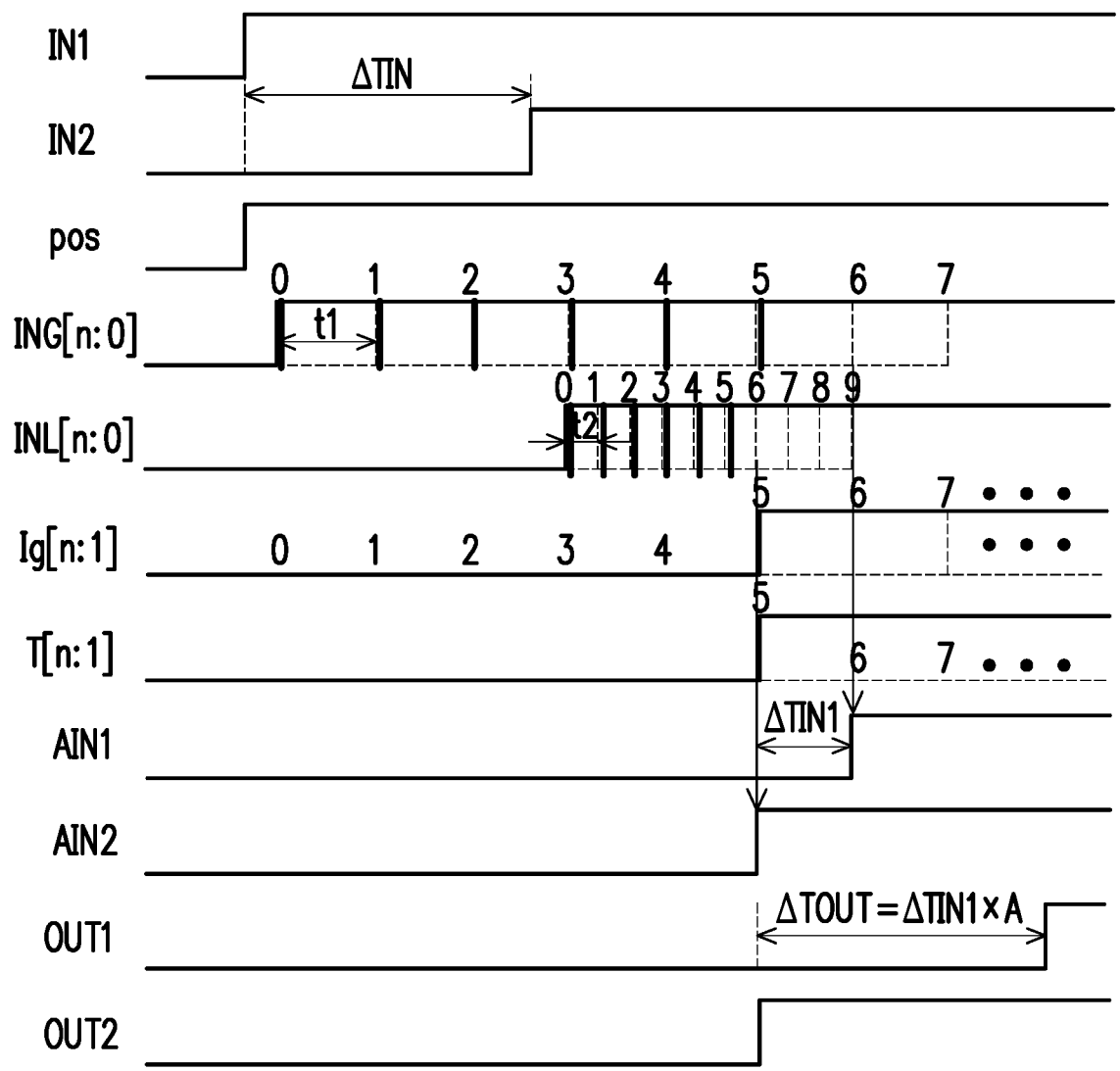

In FIG. 9A, the phase of the first front end input signal IN1 precedes the phase of the second front end input signal IN2. The phase difference between the first front end input signal IN1 and the second front end input signal IN2 provides the time difference value $\Delta$TIN, and the time difference value $\Delta$TIN is larger than the set reference value $T_{DE}$. That is to say, the time detection circuit 700 operates under the condition 2.

In the present embodiment, it can be known from operations of the first delay string 711, the second delay string 712, the latches LA1-LAn and the comparison circuits CMP1-CMPn that the time difference value $\Delta$TIN is exactly equal to the four (quotient value)-fold set reference value $T_{DE}$ plus the remainder value $\Delta$TIN'. Accordingly, the adjusted time difference value $\Delta$TIN1 is generated by subtracting the set reference value by the remainder value $\Delta$TIN'. The input signal processor 710 generates the output signals AIN1 and AIN2 to provide the adjusted time difference value $\Delta$TIN1. The time signal amplifier 720 amplifies the adjusted time difference $\Delta$TIN1 to generate signals OUT1 and OUT2, wherein the amplified time signal $\Delta$TOUT provided by the signals OUT1 and OUT2 is equal to the adjusted time difference $\Delta$TIN1 multiplied by the amplified gain A.

Figure 9B:
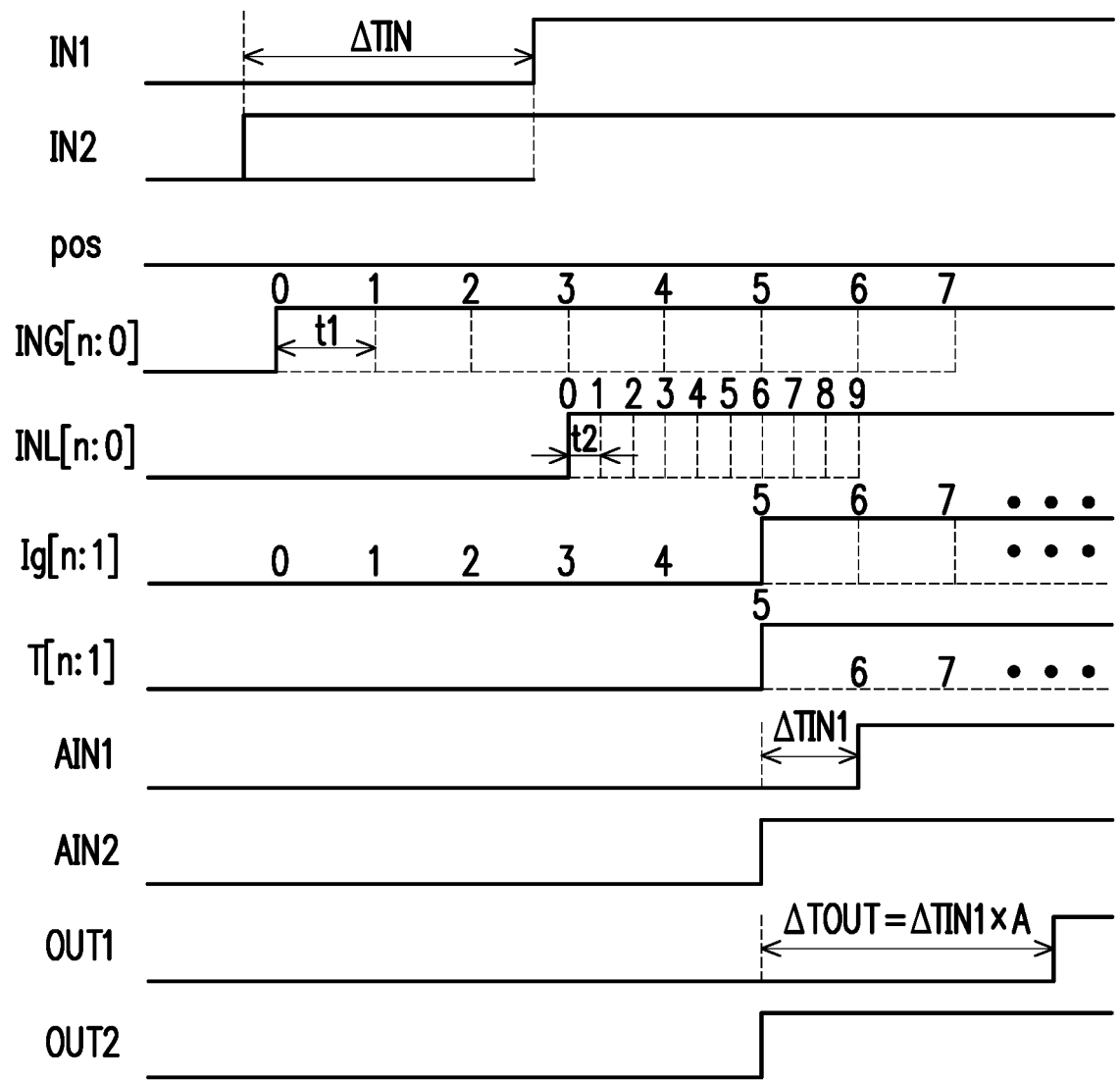

On the other hand, in FIG. 9B, the phase of the first front end input signal IN1 falls behind the phase of the second front end input signal IN2. The phase difference between the first front end input signal IN1 and the second front end input signal IN2 provides the time difference value $\Delta$TIN, and the time difference value $\Delta$TIN is larger than the set reference value $T_{DE}$. That is to say, the time detection circuit 700 also operates under the condition 2. Through the operation of the signal convertor 715, the phase of the input signal ING[0] is maintained to be preceding the phase of the input signal INL[0]. Similar to the operation waveform of FIG. 9A, the input signal processor 710 generates the output signals AIN1 and AIN2 to provide the adjusted time difference value $\Delta$TIN1, and the time signal amplifier 720 amplifies the adjusted time difference value $\Delta$TIN1 to generate signals OUT1 and OUT2, wherein the amplified time signal $\Delta$TOUT provided by the signals OUT1 and OUT2 is equal to the adjusted time difference $\Delta$TIN1 multiplied by the amplified gain A.

Figure 10:
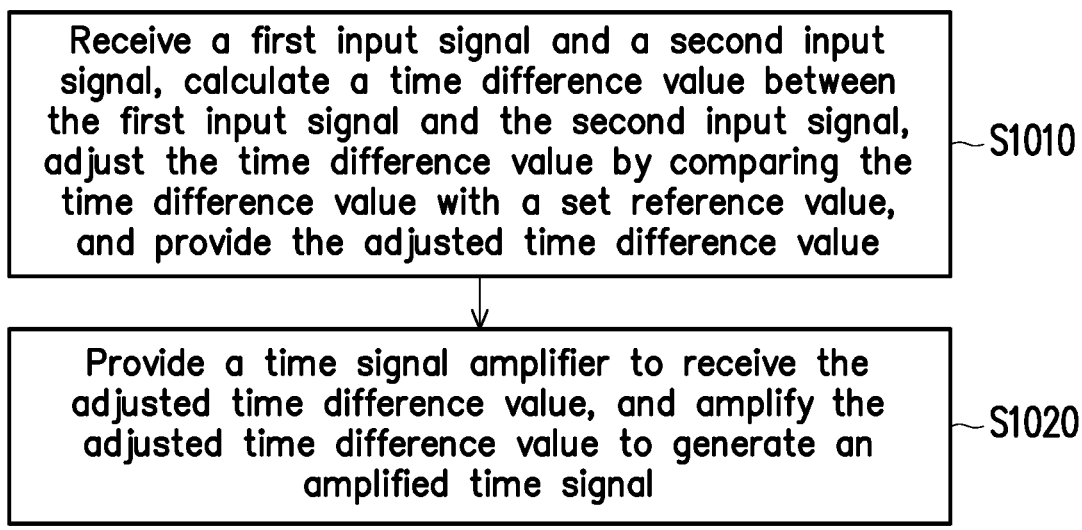
FIG. 10 shows a flowchart of a time detection method according to an embodiment of the disclosure.

Next, referring to FIG. 10, FIG. 10 shows a flow chart of a time detection method according to an embodiment of the disclosure. In the present embodiment, in step S1010, a first input signal and a second input signal are received, a time difference value between the first input signal and the second input signal is calculated, the time difference value is adjusted by comparing the time difference value with a set reference value, and the adjusted time difference value is provided. Subsequently, in step S1020, a time signal amplifier is provided to receive the adjusted time difference value, and amplify the adjusted time difference value to generate an amplified time signal, wherein the time signal amplifier operates in a linear operation region between a first time value and a second time value, and the set reference value is set according to the first time value and the second time value.

Based on the above, according to the disclosure, the first input signal and the second input signal are pre-processed, and the time difference value is adjusted, so that the adjusted time difference value falls in the linear operation region of the time signal amplifier. In this way, the distortion of the amplified time signal generated by the time signal amplifier is effectively reduced, and the accuracy of the results of time detection is improved.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A time detection circuit, comprising:
   an input signal processor, receiving a first input signal and a second input signal, calculating a time difference value between the first input signal and the second input signal, adjusting the time difference value by comparing the time difference value with a set reference value, and providing an adjusted time difference value; and
   a time signal amplifier, receiving the adjusted time difference value and amplifying the adjusted time difference value to generate an amplified time signal,
   wherein the time signal amplifier operates in a linear operation region between a first time value and a second time value, and the set reference value is set according to the first time value and the second time value.

2. The time detection circuit according to claim 1, wherein the first time value is smaller than the second time value, the set reference value is larger than the first time value, and a two-fold of the set reference value is smaller than the second time value.

3. The time detection circuit according to claim 1, wherein when the time difference value is smaller than the set reference value, the input signal processor subtracts a two-fold of the set reference value by the time difference value to generate the adjusted time difference value.

4. The time detection circuit according to claim 3, further comprising:
   a processor, coupled to the time signal amplifier, receiving the amplified time signal, and generating an output time signal according to the amplified time signal, wherein the output time signal is equal to: the two-fold of the set reference value−the amplified time signal/A, wherein A is an amplified gain of the time signal amplifier in the linear operation region.

5. The time detection circuit according to claim 1, wherein when the time difference value is not smaller than the set reference value, the input signal processor divides the time difference value by the set reference value to obtain a quotient value and a remainder value, and subtracts the two-fold of the set reference value by the remainder value to obtain the adjusted time difference value, wherein the quotient value is a positive integer.

6. The time detection circuit according to claim 5, further comprising:

a processor, coupled to the time signal amplifier, receiving the amplified time signal, and generating an output time signal according to the amplified time signal, wherein the output time signal is equal to: (N+2)×the set reference value−the amplified time signal/A, wherein A is an amplified gain of the time signal amplifier in the linear operation region, and N is a quotient value.

7. The time detection circuit according to claim 1, wherein the input signal processor comprises:

a first delay string, having a plurality of first delayers connected in series, each of the first delayers providing a first delay value, and the first delay string receiving the first input signal and generating a plurality of first delay signals;

a second delay string, having a plurality of second delayers connected in series, each of the second delayers providing a second delay value, wherein a difference value between the first delay value and the second delay value is equal to the set reference value, and the second delay string receives the second input signal and generates a plurality of second delay signals;

a plurality of latches, respectively receiving the first delay signals, respectively receiving the second delay signals, and respectively latching the second delay signals according to the first delay signals to generate a plurality of latch values;

a plurality of comparison circuits, respectively corresponding to the latches, each of the comparison circuits comparing two adjacent latch values to generate a plurality of detection values; and a multiplex circuit, receiving the first delay signals, the second delay signals and the detection values, selecting one of the first delay signals according to the detection values to generate a first output signal, and selecting one of the second delay signals according to the detection values to generate a second output signal.

8. The time detection circuit according to claim 7, wherein a time difference value between the first output signal and the second output signal is equal to the adjusted time difference value.

9. The time detection circuit according to claim 7, wherein each of the comparison circuits is an XOR gate.

10. The time detection circuit according to claim 7, wherein the multiplex circuit comprises:

a first multiplexer, selecting one of the first delay signals according to the detection values to generate the first output signal; and a second multiplexer, selecting one of the second delay signals according to the detection values to generate the second output signal.

11. The time detection circuit according to claim 7, further comprising:

a phase comparator, receiving a first front end input signal and a second front end input signal, determining whether a phase of the first front end input signal precedes a phase of the second front end input signal to generate a position signal; and a signal convertor, making one of the first front end input signal and the second front end input signal the first input signal according to the position signal, and making the other of the first front end input signal and the second front end input signal the second input signal, wherein a phase of the first input signal precedes a phase of the second input signal.

12. The time detection circuit according to claim 7, wherein the first delay value is larger than the second delay value.

13. A time detection method, comprising:

receiving a first input signal and a second input signal, calculating a time difference value between the first input signal and the second input signal, adjusting the time difference value by comparing the time difference value with a set reference value and providing an adjusted time difference value; and providing a time signal amplifier to receive the adjusted time difference value and amplify the adjusted time difference value to generate an amplified time signal, wherein the time signal amplifier operates in a linear operation region between a first time value and a second time value, and the set reference value is set according to the first time value and the second time value.

14. The time detection method according to claim 13, wherein the first time value is smaller than the second time value, the set reference value is larger than the first time value, and the two-fold of the set reference value is smaller than the second time value.

15. The time detection method according to claim 13, wherein when the time difference value is smaller than the set reference value, adjusting the time difference value by comparing the time difference value with the set reference value comprises:

subtracting a two-fold of the set reference value by the time difference value to generate the adjusted time difference value.

16. The time detection method according to claim 15, further comprising:

receiving the amplified time signal, and generating an output time signal according to the amplified time signal, wherein the output time signal is equal to: the two-fold of the set reference value−the amplified time signal/A, wherein A is an amplified gain of the time signal amplifier in the linear operation region.

17. The time detection method according to claim 13, wherein when the time difference value is not smaller than the set reference value, adjusting the time difference value by comparing the time difference value with the set reference value comprises:

dividing the time difference value by the set reference value to obtain a quotient value and a remainder value, and subtracting the two-fold of the set reference value by the remainder value to obtain the adjusted time difference value, wherein the quotient value is a positive integer.

18. The time detection method according to claim 17, further comprising:

generating an output time signal according to the amplified time signal, wherein the output time signal is equal to: (N+2)×the set reference value−the amplified time signal/A, wherein A is an amplified gain of the time signal amplifier in the linear operation region, and N is the quotient value.

\* \* \* \* \*